US010641801B2

(12) United States Patent
Su et al.

(10) Patent No.: US 10,641,801 B2
(45) Date of Patent: May 5, 2020

(54) RINGER CONTROL DEVICE AND CONTROL METHOD THEREOF

(71) Applicant: Goldtek Technology Co., Ltd., New Taipei (TW)

(72) Inventors: Ting-Hsuan Su, New Taipei (TW); Kuo-Chuan Yu, New Taipei (TW); Kuang-Hui Su, New Taipei (TW); Wen-Feng Yeh, New Taipei (TW)

(73) Assignee: Goldtek Technology Co., Ltd., New Taipei (TW)

(*) Notice: Subject to any disclaimer, the term of this patent is extended or adjusted under 35 U.S.C. 154(b) by 0 days.

(21) Appl. No.: 16/246,740

(22) Filed: Jan. 14, 2019

(65) Prior Publication Data

US 2020/0072879 A1 Mar. 5, 2020

(30) Foreign Application Priority Data

Aug. 31, 2018 (TW) .............................. 107130749 A

(51) Int. Cl.
*G01R 19/165* (2006.01)
*G08B 3/10* (2006.01)
(52) U.S. Cl.
CPC ......... *G01R 19/16519* (2013.01); *G08B 3/10* (2013.01)

(58) Field of Classification Search
CPC ............................ G01R 19/16519; G08B 3/10
USPC .......................................................... 340/328
See application file for complete search history.

(56) References Cited

U.S. PATENT DOCUMENTS 9,172,920 B1* 10/2015 Kasmir ............... H04M 1/0291
9,619,995 B2* 4/2017 Namazi ................. G08B 27/00
10,325,453 B2* 6/2019 Chen ...................... G08B 3/10

FOREIGN PATENT DOCUMENTS

TW M562474 U 6/2018

* cited by examiner

*Primary Examiner* — John A Tweel, Jr.
(74) *Attorney, Agent, or Firm* — ScienBiziP, P.C.

(57) ABSTRACT

A ringer control device includes a power receiving unit, a detection circuit, and a control circuit. The detection circuit is coupled to the power receiving unit and outputs a detection signal. The control circuit is coupled to the detection circuit and includes a trigger unit and a control unit. The trigger unit detects a trigger event. The control unit is coupled to the detection circuit and the trigger unit, and configured to control the detection circuit and determine whether a ringer device is coupled to the power module according to the detection signal, and further determine a category of the ringer device. A control method of the ringer control device is also provided.

10 Claims, 4 Drawing Sheets

RINGER CONTROL DEVICE AND CONTROL METHOD THEREOF

CROSS-REFERENCE TO RELATED APPLICATIONS

This application claims priority to Taiwanese Invention Patent Application No. 107130749 filed on Aug. 31, 2018, the contents of which are incorporated by reference herein.

FIELD

The subject matter herein generally relates to a ringer control device for detecting categories of doorbells and providing overcurrent protection and a control method of the ringer control device.

BACKGROUND

Traditional doorbell detection circuits connecting to an external digital doorbell may also electrically connect to a diode to run the doorbell. In addition, the traditional doorbell detection circuits may have different structures when connecting to the external digital doorbell and an external mechanical doorbell, but without any overcurrent protection. Therefore, the traditional doorbell detection circuits are not very well-adapted and do not have enough security.

BRIEF DESCRIPTION OF THE DRAWINGS

Many aspects of the disclosure can be better understood with reference to the following figures. The components in the figures are not necessarily drawn to scale, the emphasis instead being placed upon clearly illustrating the principles of the disclosure. Moreover, in the drawings, like reference numerals designate corresponding parts throughout the several views.

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, a given figure may be used to illustrate the features of more than one embodiment of the invention, and not all elements in the figure may be required for a given embodiment.

DETAILED DESCRIPTION

Figure 1:
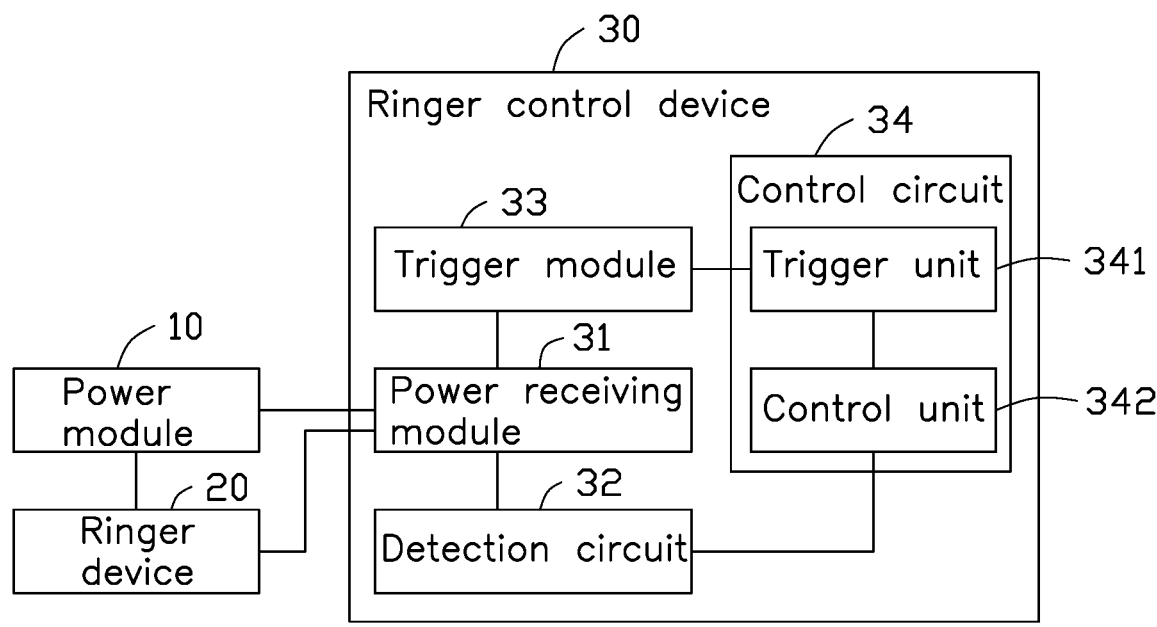
FIG. 1 is a block diagram of a first embodiment of a ringer system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Several embodiments of the invention with reference to the appended drawings are now explained. Whenever aspects of the embodiments described here are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

FIG. 1 illustrates an embodiment of a ringer system 1 including a power module 10, a ringer device 20, and a ringer control device 30. The ringer control device 30 includes a power receiving module 31, a detection circuit 32, a trigger module 33, and a control circuit 34. The control circuit 34 further includes a trigger unit 341 and a control unit 342.

In at least one embodiment, the ringer system 1 can be a door bell system applied to an access passage, which may be utilized to announce the presence of a person (or creature) in proximity thereto, and accordingly activate the ringer device 20 in order to notify the occupants on the other side of the door. In addition, triggering of the door bell system can be used to send notification to an electronic device (e.g., a portable device, not shown) that has established a connection therewith in advance to inform an owner thereof that a person or a living being's presence proximate the access passage.

In at least one embodiment, the power module 10 can be a transformer device. In at least one embodiment, the transformer device can be coupled to an AC power source (not shown) to meet the operational power requirements for the ringer device 20 and the ringer control device 30. In at least one embodiment, the power module 10 can be any form of power output device capable of stably providing the required power for the ringer device 20 and the ringer control device 30.

In at least one embodiment, the ringer device 20 can be a mechanical bell or an electronic bell. A mechanical bell generates a ringtone through mechanical collision, whereas an electronic bell produces a ringtone through broadcasting a pre-recorded music or sound. In at least one embodiment, the ringer device 20 can be coupled to the power module 10 to obtain the required power therefrom. In addition, the ringer device 20 can be coupled to the ringer control device 30, such that the ringer control device 30 may determine whether the ringer device 20 should be activated to generate ringtone.

In at least one embodiment, the power receiving unit 31 of the ringer control device 30 can be a contact power pin, such as a Pogo pin. The ringer control device 30 can obtain the power output from the power module 10 through the power receiving unit 31.

Figure 2:
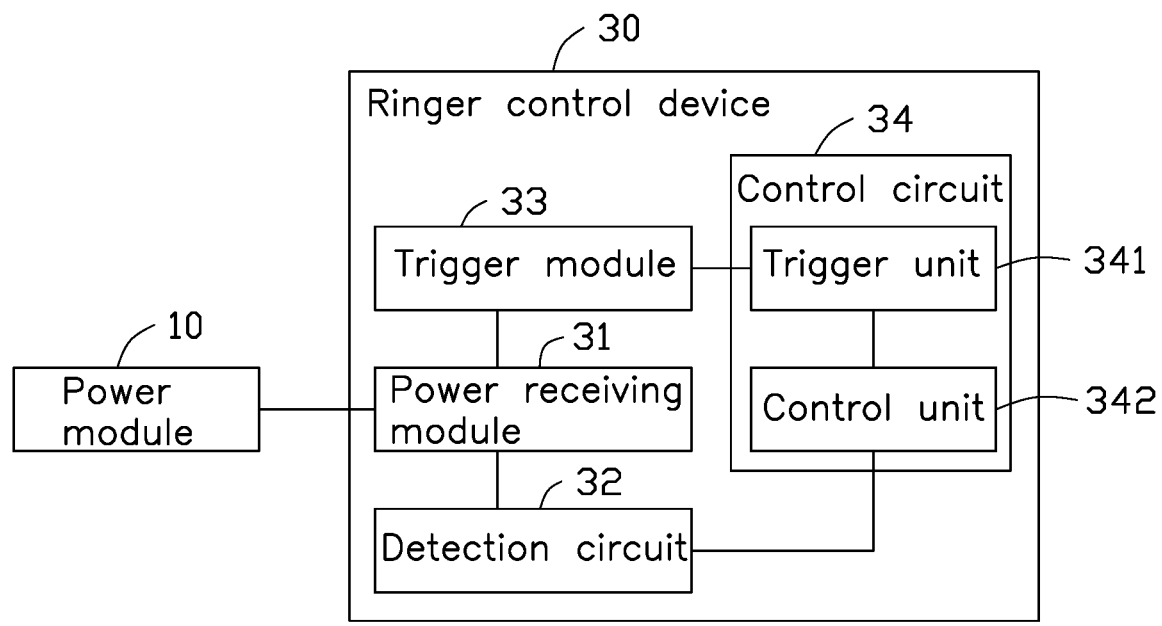
FIG. 2 is a block diagram of a second embodiment of a ringer system.

In at least one embodiment, the detection circuit 32 of the ringer control device 30 is configured to detect the presence of the ringer module 20 between the ringer control device 30 and the power module 10, and transmit a detection signal accordingly. In at least one embodiment, referring to FIG. 2, which shows a functional block diagram of a ringer control system in accordance with a second embodiment of the present disclosure, the ringer system 2 includes a power module 10 and a ringer control device 30 directly coupled to the power module 10. In this embodiment, the detection module 32 does not detect the presence of the ringer device 20, and will notify the control unit 342 the absence of a ringer device by generating an associated detection signal.

In at least one embodiment, the trigger module 33 can be any type of input device such as a touch panel, a touch screen, or a button operable to receive a triggering action. When an operator presses or touches the trigger module 33, the ringer control device 30 is activated to confirm the occurrence of a triggering event, and accordingly generate a trigger signal. If the ringer system 2 does not have a ringer device (e.g., a ringer device 20) connected thereto, the ringer control device 30 may notify the occurrence of a triggering event through other arrangements, e.g., through a communication module (not shown) and a receiving device (not shown) to communicate the trigger signal (e.g., in a wireless manner). If a ringer device 20 is present (e.g., ringer system 1), the ringer control device 30 may communicate with the abovementioned receiving device through the communication module, as well as generating a ringtone through the ringer device 20 as a trigger notification. In at least one embodiment, the trigger module 33 can include an image capturing device, which can be utilized to determine the presence of a person or other creature in the proximity thereof, thus enabling the ringer control device 30 to determine/confirm the occurrence of a triggering event.

In at least one embodiment, the control circuit 34 can be implemented on a system motherboard of the ringer control device 30. The trigger unit 341 is coupled to the trigger module 33, and configured to enable the trigger unit 341 to generate a trigger signal when the trigger module 33 is subject to a trigger action (associated with a trigger event), and transmit the trigger signal to the control unit 342, thereby notifying the control unit 342 to issue the trigger notification.

In at least one embodiment, the control unit 342 can be a processor or a microcontroller configured to execute program instructions stored in an accessible readable storage medium. In at least one embodiment, the control unit 342 is coupled to the detection circuit 32, and configured to obtain a detection result of the detection circuit 32 and store the information therein. In at least one embodiment, if the ringer system (e.g., system 1) has a ringer device connected thereto (e.g., ringer device 20), the control unit 342 can record a system parameter associated with the detection result of the ringer device 20, for example: MCU[doorbell]=1. In at least one embodiment, if the ringer system (e.g., system 2) does not have a ringer device connected thereto, the control unit 342 may record the system parameter: MCU [doorbell]=0. In at least one embodiment, the control unit 342 can be coupled to the trigger unit 341, and configured to receive the trigger signal provided by the trigger unit 341.

Figure 3:
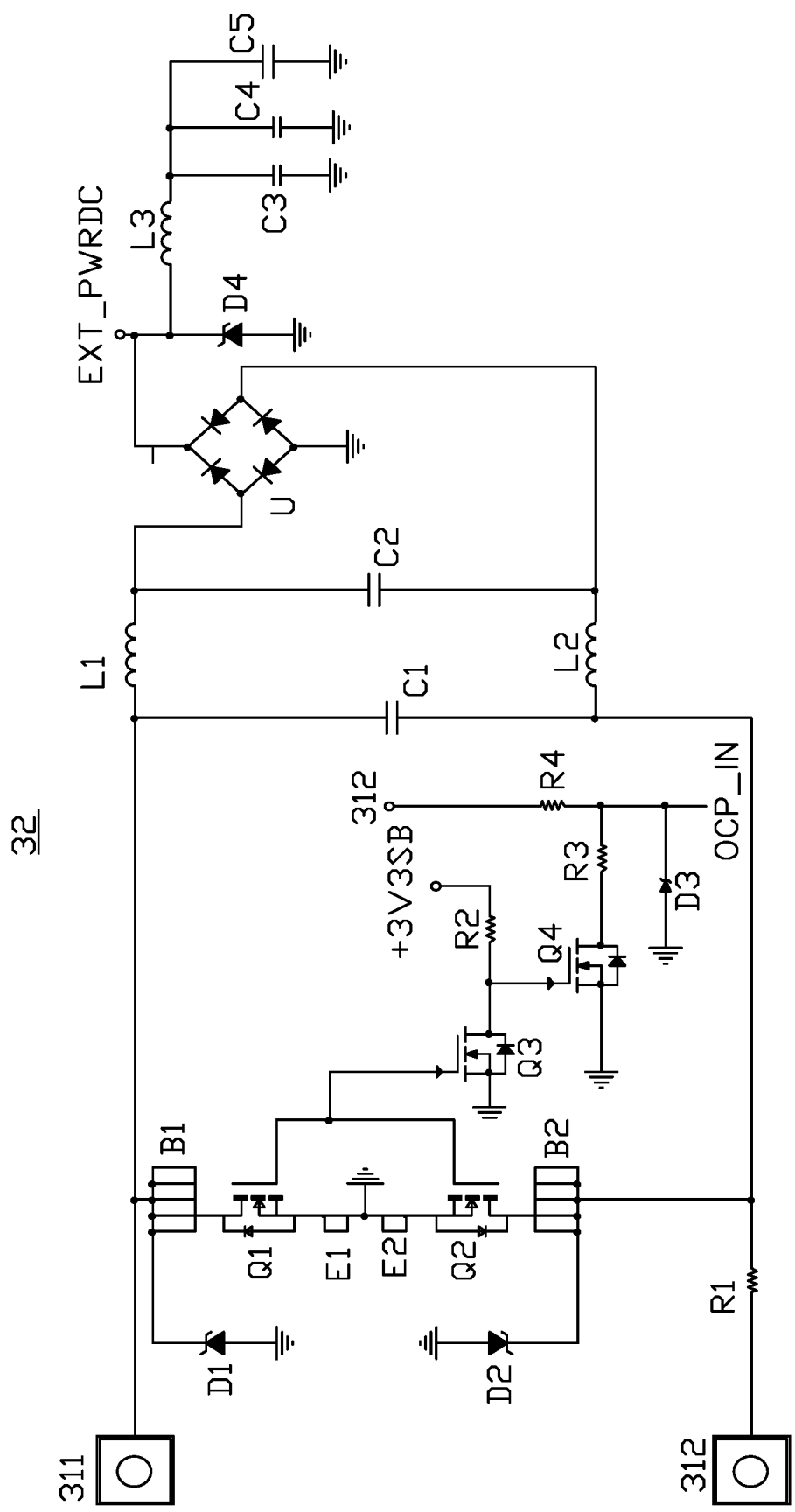
FIG. 3 is a circuit diagram of an exemplary embodiment of a detection circuit of the ringer system.

FIG. 3 shows a circuit diagram of an detection circuit 32 for the ringer control system in accordance with one embodiment of the instant disclosure. The detecting circuit 32 includes a plurality of Metal-Oxide-Semiconductor Field-Effect Transistors (MOSFETs) Q1-Q4, a plurality of diodes D1-D2, a plurality of buffer units B1-B2, a plurality of control ends E1-E2, a plurality of resistors R1-R4, a plurality of capacitors C1-C5, a plurality of inductors L1-L3, a rectifier bridge U, and plurality of nodes of the detection circuit 32: +3V3SB and EXT_PWRDC. It should be noted that, the use and connection of capacitors, inductors, resistors, diodes, switching circuits and processing circuits in the figures are only schematic connections; the circuit connection and electronic component for the detecting circuit 32 should not be limited to that illustrated in the instant figure.

In at least one embodiment, the detection circuit 32 is coupled to the power receiving unit 31 to receive an output voltage from the power module 10 (as shown in previous figures). In at least one embodiment, the power receiving unit 31 includes a first receiving unit 311 and a second receiving unit 312. The power receiving unit 31 is coupled to the detection circuit 32 through the first receiving unit 311 and the second receiving unit 312. In at least one embodiment, the first receiving unit 311 and the second receiving unit 312 can each be a Pogo pin, respectively.

A source electrode of a first MOSFET Q1 is connected to the ground through a first control end E1, a drain electrode of the first MOSFET Q1 is electrically connected to a first buffer unit B1, and a grid electrode of the first MOSFET Q1 is electrically connected to a grid electrode of a third MOSFET Q3. The first buffer unit B1 includes a plurality of capacitors or resistors, configured to absorb circuit rush to avoid any damage caused by high voltage rush generated by opening and closing processes of the first MOSFET Q1. Another end of the first buffer unit B1 is electrically connected to the first receiving unit 311 and a negative electrode of a first diode D1. A positive electrode of the first diode D1 is electrically connected to the ground.

A source electrode of a second MOSFET Q2 is electrically connected to a second control end E2, a drain electrode of the second MOSFET Q2 is electrically connected to a second buffer unit B2, and a grid electrode of the second MOSFET Q2 is electrically connected to a grid electrode of the third MOSFET Q3. The second buffer unit B2 includes a plurality of capacitors or resistors, configured to absorb circuit rush to avoid any damage caused by high voltage rush generated by opening and closing processes of the second MOSFET Q2. Another end of the second buffer unit B2 is electrically connected to the second receiving unit 312 through a first resistor R1, and also electrically connected to a negative electrode of a second diode D2. A positive of the second diode D2 is electrically connected to the ground.

A grid electrode of the third MOSFET Q3 is electrically connected to the grid electrode of the first MOSFET Q1 and the grid electrode of the second MOSFET Q2, a source electrode of the third MOSFET Q3 is electrically connected to the ground, and a drain electrode of the third MOSFET Q3 is electrically connected to the node +3V3SB through a second resistor R2.

A grid electrode of a fourth MOSFET Q4 is electrically connected to the drain electrode of the third MOSFET Q3, a source electrode of the fourth MOSFET Q4 is electrically connected to the ground, and a drain electrode of the fourth MOSFET Q4 is electrically connected to the second receiving unit 312 through a third resistor R3 and a fourth resistor R4.

A positive electrode of a third diode D3 is electrically connected to the ground, a negative electrode of the third diode D3 is electrically connected to a detection output end OCP_IN. The detection output end OCP_IN is electrically connected to the second receiving unit 312 through the fourth resistor R4. In at least one embodiment, the control unit 342 is electrically connected to the detection output end OCP_IN and receives detection signals outputted by the detection output end OCP_IN.

The first capacitor C1 and the second capacitor C2 are in parallel and electrically connected between the first receiving unit 311 and the second receiving unit 312. The first inductor L1 and the second inductor L2 are in parallel and electrically connected between the first capacitor C1 and the second capacitor C2.

The rectifier bridge U includes four ends, a first end of the rectifier bridge U is electrically connected to the first inductor L1, a second end of the rectifier bridge U is electrically connected to the second inductor L2, a third end of the rectifier bridge U is electrically connected to the node EXT_PWRDC, and a fourth end of the rectifier bridge U is electrically connected to the ground. A negative electrode of the fourth diode D4 is electrically connected to the node EXT_PWRDC, and a positive electrode of the fourth diode D4 is electrically connected to the ground. An end of the third inductor L3 is electrically connected to the node EXT_PWRDC, and another end of the third inductor L3 is electrically connected to the ground through the third capacitor C3, the fourth capacitor C4, and the fifth capacitor C5.

Figure 4:
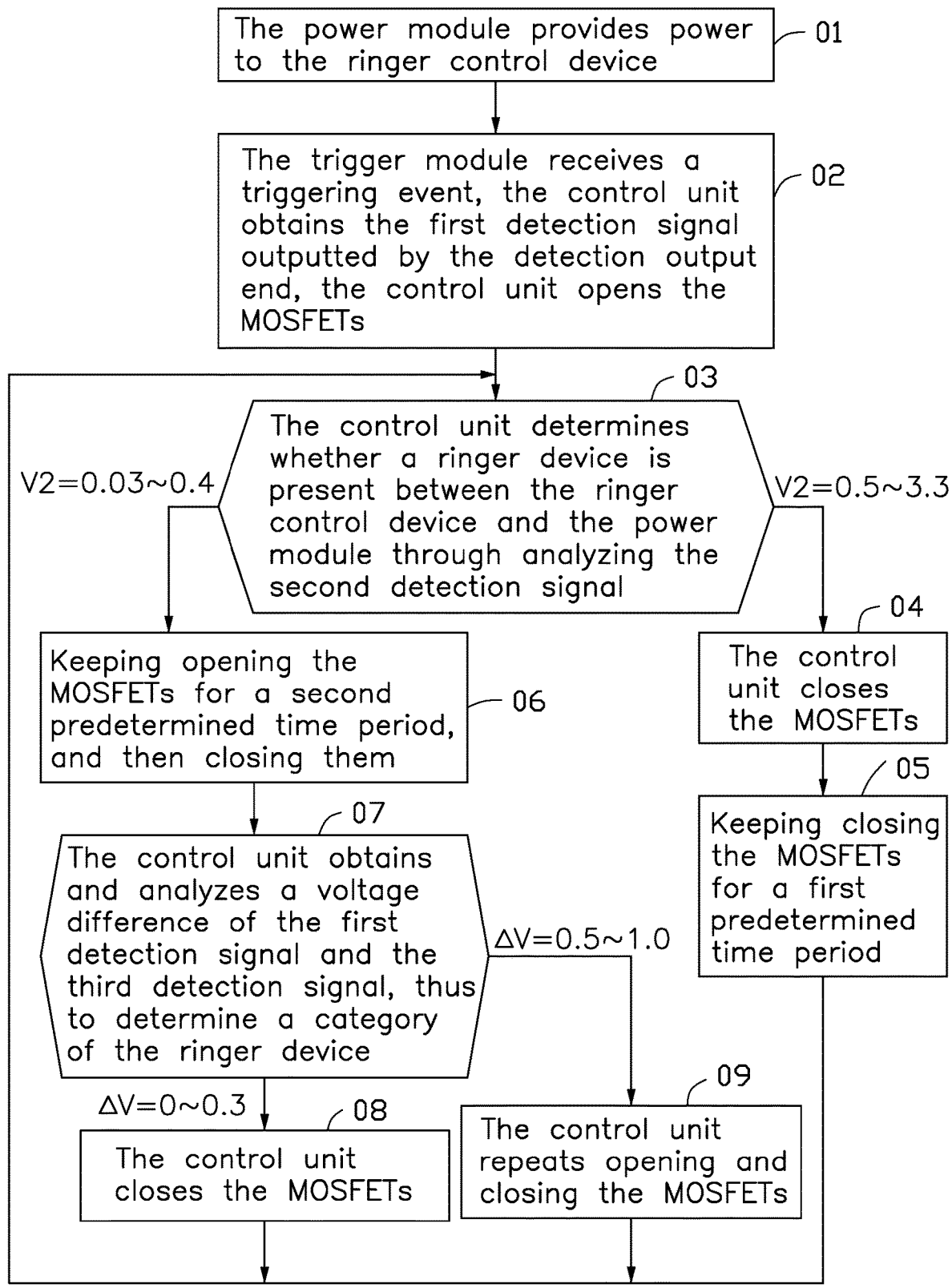
FIG. 4 is a flow chart of an exemplary embodiment of a control method of a ringer control device of the ringer system.

FIG. 4 shows a flowchart illustrating a method for controlling a ringer control device in a ringer system in accordance with the first embodiment of the instant disclosure. The method of the ringer control device 30 can be carried out using the configurations illustrated in FIGS. 1 and 2, for example, and various elements of these figures are referenced in the method. Each block shown in FIG. 4 represents one or more processes, methods or subroutines, carried out in the method. Furthermore, the illustrated order of blocks is by example only and the order of the blocks can change. Additional blocks may be added or fewer blocks may be utilized, without departing from this disclosure. The method can begin at block S01.

At block S01, the power module 10 provides power to the ringer control device 30. The ringer control device 30 receives power outputted by the power module 10 through the first receiving unit 311 and the second receiving unit 312. The power receiving unit 31, which is configured to couple an external alternating current (AC) power source (not shown), further includes a first output unit and a second output unit (now shown). The first receiving unit 311 is coupled to the first output unit, while the second receiving unit 312 is coupled to the second output unit, so as to receive an input voltage from the external AC power source through the power module 10. At this time, the MOSFET Q1-Q4 are in closed status, the detection output end OCP_IN obtains current from the second receiving unit 312 through the fourth resistor R4, thus the detection output end OCP_IN outputs a first detection signal. The power module 10 provides power to the ringer control device 30, the trigger module 33 receives triggering events from the user.

At block S02, the trigger module 33 receives a triggering event, the control unit 342 obtains the first detection signal outputted by the detection output end OCP_IN, the control unit 342 opens the first MOSFET Q1 and the second MOSFET Q2.

In at least one embodiment, the control unit 342 outputs open control signals to the first control end E1 and the second control end E2, respectively, thus to open the first MOSFET Q1 and the second MOSFET Q2, then the third MOSFET Q3 and the fourth MOSFET Q4 open accordingly, the detection output end OCP_IN outputs a second detection signal.

At block S03, the control unit 342 determines whether a ringer device 20 is present (e.g., connected) between the ringer control device 30 and the power module 10 through analyzing the second detection signal.

In at least one embodiment, the first detection signal and the second detection signal are voltage signals. When a voltage V2 of the second detection signal is within a predetermined range of 0.03-0.4V, the control unit 342 determines the ringer device 20 is present (e.g., connected) between the ringer control device 30 and the power module 10, and block S06 is processed. When the voltage V2 of the second detection signal is within a predetermined range of 0.5-3.3V, the control unit 342 determines the ringer device 20 is not present (e.g., connected) between the ringer control device 30 and the power module 10 and a short circuit has happened, and block S04 is processed.

At block S04, the control unit 342 closes the first MOSFET Q1 and the second MOSFET Q2.

In at least one embodiment, the control unit 342 outputs close control signals to the first control end E1 and the second control end E2, respectively, thus to close the first MOSFET Q1 and the second MOSFET Q2.

At block S05, the first MOSFET Q1 and the second MOSFET Q2 are kept closed for a first predetermined time period.

In at least one embodiment, the first predetermined time period is 10 seconds. During the first predetermined time period of keeping closing the first MOSFET Q1 and the second MOSFET Q2, the trigger module 33 stops receiving the triggering events. After reaching the first predetermined time period, the trigger module 33 recovers to receive the triggering events, and block S02 is processed.

In another exemplary embodiment, the control unit 342 records the short circuit flag information. After the user debugs the short circuit, the control unit 342 removes the short circuit flag, the trigger module 33 recovers to receive the triggering events, and block S02 is processed.

At block S06, the first MOSFET Q1 and the second MOSFET Q2 are kept opened for a second predetermined time period, and then the first MOSFET Q1 and the second MOSFET Q2 are kept closed.

In at least one embodiment, the second predetermined time period is 250 milliseconds. During the second predetermined time period of keeping opening the first MOSFET Q1 and the second MOSFET Q2, the first MOSFET Q1, the second MOSFET Q2, the third MOSFET Q3, and the fourth MOSFET Q4 are continuously open, the detection output end OCP_IN outputs a third detection signal.

At block S07, the control unit 342 obtains and analyzes a voltage difference of the first detection signal and the third detection signal, thus to determine a category of the ringer device 20.

In at least one embodiment, the third detection signal is a voltage signal. When the voltage difference of the first detection signal and the third detection signal is within a predetermined range of 0-0.3V, the control unit 342 determines that the ringer device 20 is a mechanical ringer, and block S08 is processed. When the voltage difference of the first detection signal and the third detection signal is within a predetermined range of 0.5-1.0V, the control unit 342 determines that the ringer device 20 is a digital ringer, and block S09 is processed.

At block S08, the control unit 342 closes the first MOSFET Q1 and the second MOSFET Q2.

In at least one embodiment, the control unit 342 outputs close control signals to the first control end E1 and the second control end E2, respectively, thus to close the first MOSFET Q1 and the second MOSFET Q2.

At block S09, the control unit 342 repeats opening and closing the first MOSFET Q1 and the second MOSFET Q2 to continuously run the digital ringer.

In at least one embodiment, the control unit 342 repeats opening and closing the first MOSFET Q1 and the second MOSFET Q2 according to a switching frequency. The switching frequency can be opening for 120 milliseconds and closing for 60 milliseconds.

The ringer control device 30 determines whether a ringer device 20 is present (e.g., connected) between the ringer control device 30 and the power module 10 by the detection circuit 32. When determining no ringer device 20 is present (e.g., connected) between the ringer control device 30 and the power module 10 by the detection circuit 32, then a short circuit protection mechanism is activated to avoid further damage. When determining a ringer device 20 is present (e.g., connected) between the ringer control device 30 and the power module 10 by the detection circuit 32, a category of the ringer device 20 is then determined. In addition, the ringer control device 30 obtains power by electrically connecting to the power module 10 to trigger the ringer device 20, then a battery or an internal super capacitor can be omitted in the ringer control device 30, which makes a simple structure for the ringer control device 30.

The embodiments shown and described above are only examples. Many details are often found in the art such as the other features. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims. It is believed that the embodiments and their advantages will be understood from the foregoing description, and it will be apparent that various changes may be made thereto without departing from the scope of the disclosure or sacrificing all of its advantages, the examples hereinbefore described merely being illustrative embodiments of the disclosure.

What is claimed is:

1. A ringer control device, comprising:
    a power receiving unit;
    a detection circuit coupled to the power receiving unit, configured to output a detection signal; and
    a control circuit coupled to the detection circuit and comprising:
        a trigger unit configured to detect a trigger event; and
        a control unit coupled to the detection circuit and the trigger unit, configured to control the detection circuit and determine whether a ringer device is coupled to the power receiving unit according to the detection signal, and further determine a category of the ringer device;
    wherein the detection circuit comprises a plurality of Metal-Oxide-Semiconductor Field-Effect Transistors (MOSFETs) and a plurality of control ends, the control unit is electrically connected to the plurality of control ends; the plurality of control ends is electrically connected to the plurality of MOSFETs; the control unit outputs open control signals and close control signals to the plurality of control ends to open and close the plurality of MOSFETs.

2. The ringer control device as claimed in claim 1, wherein the detection circuit further comprises a detection output end; the control unit is electrically connected to the detection output end and receives detection signals from the detection output end.

3. The ringer control device as claimed in claim 2, wherein the power receiving unit comprises a first receiving unit and a second receiving unit and is configured to receive power from a power module, the detection circuit comprises a first MOSFET, a second MOSFET, a third MOSFET, a fourth MOSFET, a first control end, and a second control end; a source electrode of a first MOSFET is connected to a ground through the first control end, a drain electrode of the first MOSFET is electrically connected to the first receiving unit; a source electrode of the second MOSFET is electrically connected to the second control end, a drain electrode of the second MOSFET is electrically connected to the second receiving unit through a first resistor; a grid electrode of the first MOSFET and a grid electrode of the second MOSFET both are electrically connected to a grid electrode of the third MOSFET, a source electrode of the third MOSFET is electrically connected to the ground, and a drain electrode of the third MOSFET is electrically connected to a grid electrode of the fourth MOSFET; a source electrode of the fourth MOSFET is electrically connected to the ground, and a drain electrode of the fourth MOSFET is electrically connected to the detection output end.

4. The ringer control device as claimed in claim 3, wherein the detection circuit comprises a buffer unit, a second buffer unit, a first diode, a second diode, a third diode, a second resistor, a third resistor, and a fourth resistor; the first buffer unit is electrically connected between the drain electrode of the first MOSFET and the first receiving unit, the first buffer unit is further electrically connected to the ground through the first diode; the second buffer unit is electrically connected between the drain electrode of the second MOSFET and the second receiving unit, the second buffer unit is further electrically connected to the ground through the second diode; the first buffer unit and the second buffer unit both comprise a plurality of capacitors or resistors, are configured to absorb circuit rush.

5. The ringer control device as claimed in claim 4, wherein the drain electrode of the third MOSFET is electrically connected to a node of the detection circuit through the second resistor; the drain electrode of the fourth MOSFET is electrically connected to the detection output end through the third resistor, and is further electrically connected to the second receiving unit through the fourth resistor; the detection output end is further electrically connected to the ground through the third diode.

6. The ringer control device as claimed in claim 5, wherein the first receiving unit and the second receiving unit receive power from the power module, the plurality of MOSFETs are in closed status, the detection output end obtains current from the second receiving unit through the fourth resistor and outputs a first detection signal.

7. The ringer control device as claimed in claim 6, wherein when the trigger unit receives a trigger event, the control unit obtains the first detection signal outputted by the detection output end, and outputs open control signals to the first control end and the second control end, thus opens the first MOSFET and the second MOSFET, then the third MOSFET and the fourth MOSFET open accordingly, the detection output end outputs a second detection signal.

8. The ringer control device as claimed in claim 7, wherein the first detection signal and the second detection signal are voltage signals, when a voltage of the second detection signal is within a first predetermined range, the control unit determines no ringer device is connected to the ringer control device, and outputs close control signals to the first control end and the second control end, respectively, thus closes the first MOSFET and the second MOSFET, and keeps closing the first MOSFET and the second MOSFET for a first predetermined time period, during the first predetermined time period, the trigger module stops receiving the triggering events, when the first predetermined time period ends, the trigger module resumes to receive the triggering events.

9. The ringer control device as claimed in claim 8, wherein when the voltage of the second detection signal is within a second predetermined range, the control unit determines a ringer device is connected to the ringer control device, and keeps opening the first MOSFET and the second MOSFET for a second predetermined time period, and then closing them; during the second predetermined time period, the first MOSFET, the second MOSFET, the third MOSFET, and the fourth MOSFET are continuously open, the detection output end outputs a third detection signal, the third detection signal is a voltage signal, the control unit obtains and analyzes a voltage difference of the first detection signal and the third detection signal, when the voltage difference of the first detection signal and the third detection signal is within a third predetermined range, the control unit determines that the ringer device is a mechanical ringer, and outputs close control signals to the first control end and the second control end, respectively, to close the first MOSFET and the second MOSFET; when the voltage difference of the first detection signal and the third detection signal is within a fourth predetermined range, the control unit determines that the ringer device is a digital ringer, and repeats opening and closing the first MOSFET and the second MOSFET.

10. A control method of a ringer control device, the control method comprising:
  receiving power from a power module and obtaining a first detection signal;
  receiving a trigger event, opening a plurality of MOSFETs, and obtaining a second detection signal;
  when determining the second detection signal is within a first predetermined range, then determining no ringer device is connected to the ringer control device, and closing the plurality of MOSFETs for a first predetermined time period;
  when determining the second detection signal is within a second predetermined range, then determining a ringer device is connected to the ringer control device, and opening the plurality of MOSFETs for a second predetermined time period, and then closing the plurality of MOSFETs when the second predetermined time period ends, during the second predetermined time period, obtaining a third detection signal, and analyzing a voltage difference of the first detection signal and the third detection signal;
  when determining the voltage difference of the first detection signal and the third detection signal is within a third predetermined range, then determining that the ringer device is a mechanical ringer, and closing the plurality of MOSFETs; and
  when determining the voltage difference of the first detection signal and the third detection signal is within a fourth predetermined range, then determining that the ringer device is a digital ringer, and repeating opening and closing the plurality of MOSFETs.

* * * * *